(12) United States Patent
Zhou et al.

(10) Patent No.: US 10,923,548 B2
(45) Date of Patent: Feb. 16, 2021

(54) DISPLAY PANEL AND METHOD FOR MANUFACTURING SAME

(71) Applicant: WUHAN CHINA STAR OPTOELECTRONICS SEMICONDUCTOR DISPLAY TECHNOLOGY CO., LTD., Hubei (CN)

(72) Inventors: Zhiwei Zhou, Hubei (CN); Seungkyu Choi, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 16/468,679

(22) PCT Filed: Apr. 1, 2019

(86) PCT No.: PCT/CN2019/080878
§ 371 (c)(1),
(2) Date: Jun. 12, 2019

(87) PCT Pub. No.: WO2020/172946
PCT Pub. Date: Sep. 3, 2020

(65) Prior Publication Data
US 2020/0273930 A1    Aug. 27, 2020

(51) Int. Cl.
*H01L 27/32* (2006.01)
*H01L 51/52* (2006.01)
*H01L 51/56* (2006.01)

(52) U.S. Cl.
CPC ...... *H01L 27/3262* (2013.01); *H01L 27/3276* (2013.01); *H01L 51/5253* (2013.01); *H01L 51/56* (2013.01); *H01L 2227/323* (2013.01)

(58) Field of Classification Search
CPC combination set(s) only.
See application file for complete search history.

(56) References Cited

U.S. PATENT DOCUMENTS

2017/0092708 A1    3/2017  Jeon
2017/0117502 A1*   4/2017  Park ................. H01L 51/56
(Continued)

FOREIGN PATENT DOCUMENTS

CN    108091679 A    5/2018
CN    108232033 A    6/2018
(Continued)

*Primary Examiner* — Ratisha Mehta
(74) *Attorney, Agent, or Firm* — Mark M. Friedman

(57) ABSTRACT

The present disclosure provides a display panel having a display area and a non-display area surrounding the display area, wherein a stress releasing structure is disposed in the non-display area for releasing stress, the stress releasing structure including a substrate; a first inorganic material layer disposed on the substrate; a first patterned conductor layer disposed on the first inorganic material layer; a second inorganic material layer disposed on the first inorganic material layer and the first patterned conductor layer; a third inorganic material layer disposed on the second inorganic material layer; and a second patterned conductor layer disposed on the third inorganic material layer, wherein the second patterned conductor layer is connected to the first patterned conductor layer via at least one first through-hole.

18 Claims, 3 Drawing Sheets

(56) References Cited

U.S. PATENT DOCUMENTS

2019/0393443 A1 12/2019 Chen
2020/0258913 A1* 8/2020 Park .................. G06F 3/0443

FOREIGN PATENT DOCUMENTS

| CN | 108550617 A | 9/2018 |
| CN | 108598113 A | 9/2018 |
| KR | 20140086639 A | 7/2014 |

* cited by examiner

DISPLAY PANEL AND METHOD FOR MANUFACTURING SAME

FIELD OF INVENTION

The present disclosure relates to a field of display technology, and more particularly, to a display panel and a method for manufacturing the same.

BACKGROUND

Display panels of displays, such as organic light emitting diode (OLED) displays, have laminated structures composed of some inorganic films. As OLED displays are bent, stress tends to accumulate in the inorganic films. According to Griffith theory of fracture, this makes micro-cracks in outer peripheral regions of OLED display panels, which continuously extend inwards and towards an electrostatic discharge (ESD) preventing area, a gate driver on array (GOA) area, and an active area (AA) of OLED display panels. Thus, electrical characteristics of displays are affected, resulting in abnormally displayed images.

Although for conventional OLED display panels, crack extension preventing structures, e.g., an interlayer dielectric (ILD) slit structure, are formed in the outer peripheral regions of OLED display panels to prevent cracks generated during cutting or bending processes of display panels from extending from the outer peripheral regions towards inside of the panels, the ILD slit structures cannot effectively prevent rapid extension of cracks generated due to panels being bent thousands of times at different frequencies. In addition, because the ILD slit structure is positioned to be so close to cutting lines of panels, the ILD slit structure would be easily damaged due to over-cutting and thus completely lose its function of preventing extension of cracks.

Therefore, there is a need to provide a display panel and a method for manufacturing the same to solve problems existing in prior art.

SUMMARY OF DISCLOSURE

Technical Problems

The objective of the present disclosure is to provide a display panel and a method for manufacturing the same in order to solve problems existing in prior art, where the display panels are bent, making cracks extend towards inside of the display panel, and causing abnormally displayed images.

Technical Solutions

The present disclosure provides a display panel having a display area and a non-display area surrounding the display area, wherein a stress releasing structure is disposed in the non-display area for releasing stress, the stress releasing structure comprising:
a substrate;
a first inorganic material layer disposed on the substrate;
a first patterned conductor layer disposed on the first inorganic material layer;
a second inorganic material layer disposed on the first inorganic material layer and the first patterned conductor layer;
a third inorganic material layer disposed on the second inorganic material layer; and
a second patterned conductor layer disposed on the third inorganic material layer and connected to the first patterned conductor layer via at least one first through-hole.

In accordance with one preferred embodiment of the present disclosure, the display area includes an active area, and the non-display area includes a gate driver on array (GOA) area, a power wiring area, and an electrostatic discharge (ESD) preventing area from inside of the display panel towards outside of the display panel; and a thin film encapsulation layer covers the active area, the GOA area, the power wiring area, and the ESD preventing area.

In accordance with one preferred embodiment of the present disclosure, the stress releasing structure is positioned in a region outside of an outer edge of a region covered by the thin film encapsulation layer.

In accordance with one preferred embodiment of the present disclosure, the display panel further comprises a crack extension preventing structure; the stress releasing structure is positioned between the outer edge of the region covered by the thin film encapsulation layer and the crack extension preventing structure; and the stress releasing structure further comprises a patterned organic planarization layer, and the patterned organic planarization layer is disposed on the second patterned conductor layer.

In accordance with one preferred embodiment of the present disclosure, the stress releasing structure is positioned in a region between an outer edge of a region covered by the thin film encapsulation layer and an outer edge of the ESD preventing area.

In accordance with one preferred embodiment of the present disclosure, the stress releasing structure is positioned in a region between an outer edge of a region covered by the thin film encapsulation layer and an outer edge of the power wiring area.

In accordance with one preferred embodiment of the present disclosure, the stress releasing structure further comprises a third patterned conductor layer disposed on the second inorganic material layer; and the second patterned conductor layer is connected to the third patterned conductor layer via at least one second through-hole.

In accordance with one preferred embodiment of the present disclosure, the third patterned conductor layer has a line width ranging from 5 μm to 8 μm, and the third patterned conductor layer is spaced from another adjacent third patterned conductor layer by an interval ranging from 6 μm to 9 μm.

In accordance with one preferred embodiment of the present disclosure, wherein transistors are disposed in the active area and the GOA area, and each of the transistor includes a polysilicon layer, a gate electrode, a via hole, and a source electrode and drain electrode; and
the first patterned conductor layer is disposed at a same layer as where the gate electrode is disposed in the active area or the GOA area, and is made of a same material as that of the gate electrode; the second patterned conductor layer is disposed at a same layer as where the source electrode and the drain electrode are disposed in the active area or the GOA area, and is made of a same material as that of the source electrode and the drain electrode; the first through-hole is disposed at a same layer as where the via hole is disposed in the active area or the GOA area.

In addition, the present disclosure provides a method for manufacturing a display panel having a display area and a non-display area surrounding the display area, wherein the method includes forming a stress releasing structure in the non-display area for releasing stress, formation of the stress releasing structure comprising steps of:

providing a substrate;

forming a first inorganic material layer on the substrate;

forming a first patterned conductor layer on the first inorganic material layer;

forming a second inorganic material layer on the first inorganic material layer and the first patterned conductor layer;

forming a third inorganic material layer on the second inorganic material layer; and forming a second patterned conductor layer on the third inorganic material layer, wherein the second patterned conductor layer is connected to the first patterned conductor layer via at least one first through-hole.

Advantageous Effects

The present disclosure provides a display panel and a method for manufacturing the same. According to the present disclosure, a stress releasing structure is disposed in a non-display area of the display panel for releasing stress. The stress releasing structure is formed at the same time as a transistor formed in an active area or a gate driver on array (GOA) area using same mask. Therefore, formation of the stress releasing structure does not remarkably increase manufacturing cost of display panels. The present disclosure provides a design that has low manufacturing cost. In addition, the display panel does not require additional space to accommodate the stress releasing structure. The stress releasing structure is formed in outer peripheral region of the display panel. Therefore, once the display panel is bent, stress accumulated in the inorganic films can be effectively released by the tress releasing structure. The present disclosure prevents cracks from extending towards inside of display panel, and avoids abnormally displayed images.

DETAILED DESCRIPTION

Figure 1:
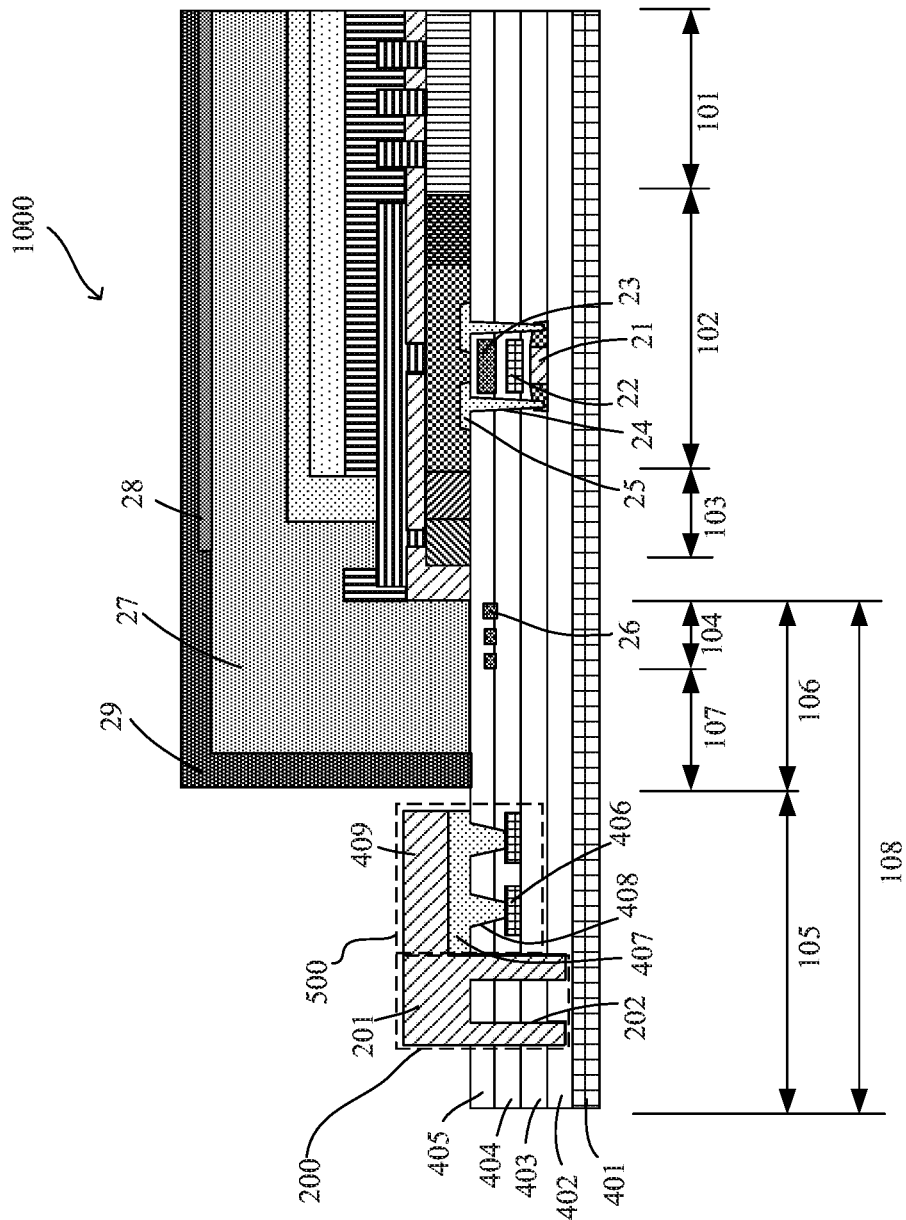
FIG. 1 shows a cross-sectional view of an organic light emitting diode (OLED) display panel according to EMBODIMENT ONE of the present disclosure.

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, the same reference symbol represents the same or similar components.

The present disclosure provides a display panel and a method for manufacturing the same. According to the present disclosure, a stress releasing structure 500 is formed at the same time as a transistor formed in an active area 101 or a gate driver on array (GOA) area 102 using the same mask. Therefore, formation of the stress releasing structure 500 does not remarkably increase manufacturing cost of display panels. The present disclosure provides a design that has low manufacturing cost. In addition, the display panel 1000 does not require additional space to accommodate the stress releasing structure 500. The stress releasing structure 500 is formed in an outer peripheral region 108 of the display panel. Therefore, once the display panel 1000 is bent, stress accumulated in inorganic films can be effectively released by the stress releasing structure 500. The present disclosure prevents cracks from extending towards inside of the display panel, and avoids abnormally displayed images.

The present disclosure provides three embodiments, as described in EMBODIMENT ONE, EMBODIMENT TWO, and EMBODIMENT THREE below.

Embodiment One

Please refer to FIG. 1, which shows a cross-sectional view of an organic light emitting diode (OLED) display panel according to EMBODIMENT ONE of the present disclosure.

According to the present disclosure, the stress releasing structure 500 can be disposed in a display panel 1000, such as an organic light emitting diode (OLED) display panel 1000. However, the present disclosure is not limited thereto. Based on different products, the stress releasing structure 500 can be disposed in various types of display panels, e.g., a liquid crystal display panel. As long as the stress releasing structure functions to release stress in the display panel and prevent extension of cracks, such a display panel falls within scope intended to be protected by the present disclosure. The OLED display panel will be used as an example to provide detailed description of the present disclosure.

The OLED display panel 1000 includes a substrate 401, a buffer layer 402, and a plurality of inorganic material layers 403, 404, and 405. The buffer layer 402 and the inorganic material layers 403, 404, and 405 are all made of an inorganic material.

The OLED display panel 1000 has a display area and a non-display area surrounding the display area. The display area includes an active area (AA) 101. The active area 101 is the area where images are displayed. The non-display area includes a gate driver on array (GOA) area 102, a power wiring area 103, and an electrostatic discharge (ESD) preventing area 104 from inside of the display panel towards outside of the display panel. The GOA area 102 is the area where circuits for driving gate electrodes are disposed. The ESD preventing area 104 is the area where the ESD preventing wirings 26 are formed to protect electrical components in the display panel from being damaged by electrostatic discharges.

Moreover, the OLED display panel 1000 includes a thin film encapsulation layer. The thin film encapsulation layer includes:

a first inorganic encapsulation layer 27;

an organic encapsulation layer 28 disposed on the first inorganic encapsulation layer 27; and a second inorganic encapsulation layer 29 disposed on the organic encapsulation layer 28.

The thin film encapsulation layer covers the active area 101, the GOA area 102, the power wiring area 103, and the ESD preventing area 104. Transistors are disposed in the active area 101 and/or the GOA area 102, and each of the transistors is composed of a polysilicon layer 21, a gate electrode 22/23, a via hole 24, and a source and drain electrode 25.

In addition, the display panel 1000 further comprises a crack extension preventing structure, such as an interlayer dielectric (ILD) slit structure 200. As shown in FIG. 1, the ILD slit structure 200 is formed by filling a via hole 202 with an organic material 201. The ILD slit structure 200 is positioned in a region 105 outside of an outer edge of a region covered by the thin film encapsulation layer 27, 28, and 29. The ILD slit structure 200 prevents cracks generated during cutting process or bending process of display panel 1000 from extending from outer peripheral regions towards inside of the panels.

Thus, the EMBODIMENT ONE of the present disclosure provides the display panel 1000 having a display area and a non-display area surrounding the display area, wherein the stress releasing structure 500 is disposed in the non-display area for releasing stress, the stress releasing structure 500 comprising:

a substrate 401;

a first inorganic material layer 403 (e.g., a first gate insulation layer) disposed on the substrate 401;

a first patterned conductor layer 406 (e.g., a first gate electrode layer) disposed on the first inorganic material layer 403;

a second inorganic material layer 404 (e.g., a second gate insulation layer) disposed on the first inorganic material layer 403 and the first patterned conductor layer 406;

a third inorganic material layer 405 (e.g., an interlayer dielectric layer) disposed on the second inorganic material layer 404; and a second patterned conductor layer 407 (e.g., a source and drain electrode layer) disposed on the third inorganic material layer 405 and connected to the first patterned conductor layer 406 via at least one first through-hole 408.

In the present EMBODIMENT ONE, the stress releasing structure 500 is positioned in the region 105 outside of the outer edge of the region covered by the thin film encapsulation layer 27, 28, and 29. For example, the stress releasing structure 500 could be positioned between the outer edge of the region covered by the thin film encapsulation layer 27, 28, and 29 and the crack extension preventing structure 200. Preferably, the stress releasing structure 500 adjoins the crack extension preventing structure 200.

In the present EMBODIMENT ONE, the stress releasing structure 500 further comprises a patterned organic planarization layer 409. The patterned organic planarization layer 409 is disposed on the second patterned conductor layer 407. The patterned organic planarization layer 409 is formed at the same time as the organic material 201 filling the via hole 202 of the crack extension preventing structure 200. Thus, the patterned organic planarization layer 409 and the organic material 201 are formed at the same time and thus are disposed at the same layer, and are formed by same material.

The first patterned conductor layer 406, the second patterned conductor layer 407, and the first through-hole 408 are respectively formed at the same time as the gate electrode 22/23, the source and drain electrode 25, and the via hole 24 are formed in the active area 101 or the GOA area 102. Thus, the first patterned conductor layer 406 is disposed at the same layer as where the gate electrode 22/23 is disposed in the active area 101 or the GOA area 102, and is made of the same material as that of the gate electrode 22/23. The second patterned conductor layer 407 is disposed at the same layer as where the source and drain electrode 25 is disposed in the active area 101 or the GOA area 102, and is made of the same material as that of the source and drain electrode 25. The first through-hole 408 is disposed at the same layer as where the via hole 24 is disposed in the active area 101 or the GOA area 102.

Preferably, the first patterned conductor layer 406, the ESD preventing wirings 26, and the gate electrode 22/23 are made of molybdenium. Preferably, the second patterned conductor layer 407 and the source and drain electrode 25 are made of titanium/aluminum/titanium.

EMBODIMENT ONE of the present disclosure is characterized in that the stress releasing structure 500 is positioned in the region 105 outside of the outer edge of the region covered by the thin film encapsulation layer 27, 28, and 29. The stress releasing structure 500 is formed at the same time as the transistor formed in the active area 101 or the GOA area 102 using the same mask. Therefore, formation of the stress releasing structure 500 does not remarkably increase manufacturing cost of display panels. The present disclosure provides a design that has low manufacturing cost. In addition, the display panel 1000 does not require additional space to accommodate the stress releasing structure 500. The stress releasing structure 500 is formed in the outer peripheral region 108 (specifically in the region 105) of the display panel 1000. Thus, the present disclosure provides a design that does not affect the original structure of the display panel. Moreover, the patterned organic planarization layer 409 is made an organic polymer material that has excellent anti-bending property, and the second patterned conductor layer 407 is made of titanium/aluminum/titanium that is flexible. Therefore, the stress releasing structure 500 can effectively release stress accumulated in the inorganic films (such as the buffer layer 402, the first inorganic material layer 403, the second inorganic material layer 404, and the third inorganic material layer 405) in the outer peripheral region of the display panel, thus preventing cracks from extending from peripheral region of the display panel towards inside of display panel, and avoiding abnormally displayed images.

Embodiment Two

Figure 2:
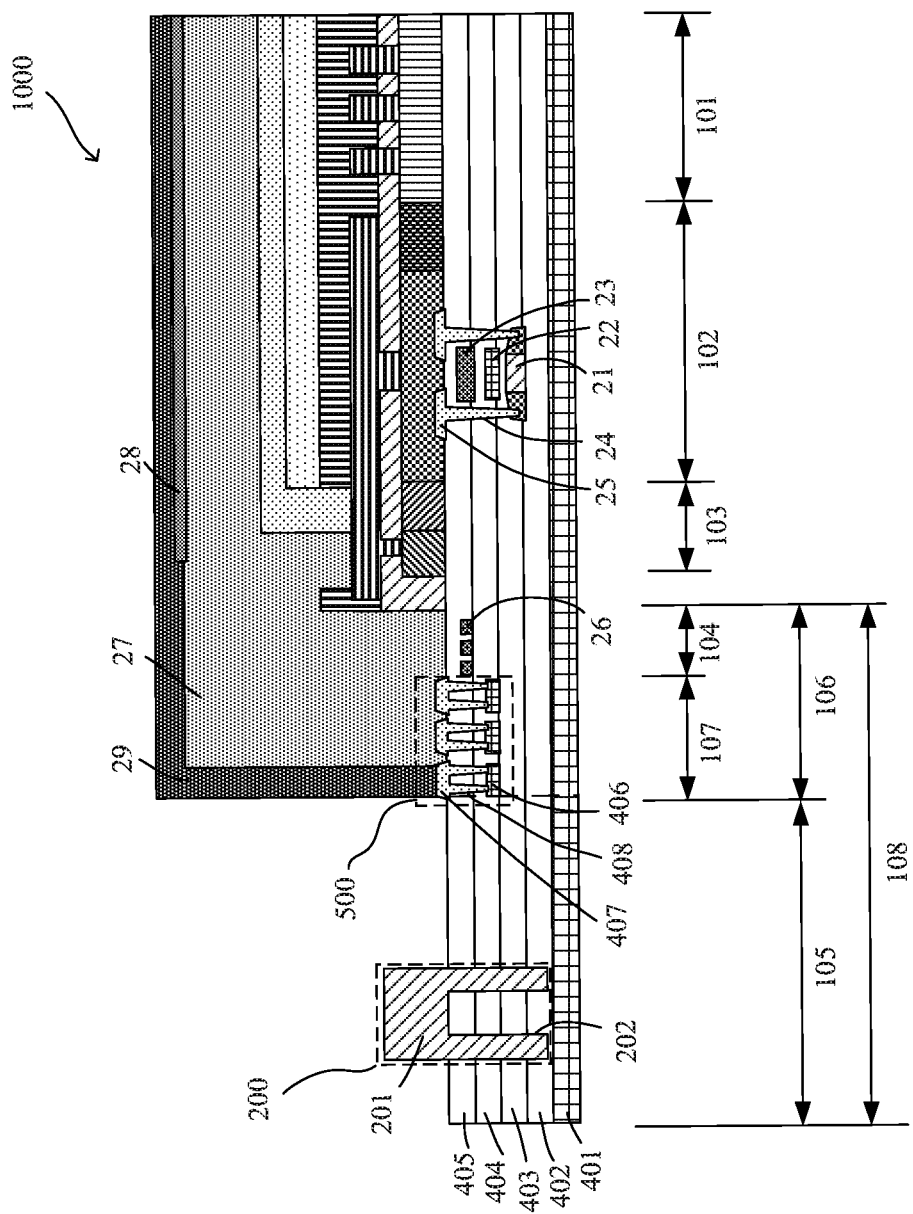
FIG. 2 shows a cross-sectional view of an OLED display panel according to EMBODIMENT TWO of the present disclosure.

Please refer to FIG. 2, which shows a cross-sectional view of an OLED display panel according to EMBODIMENT TWO of the present disclosure.

The present EMBODIMENT TWO differs from the EMBODIMENT ONE in that, in the EMBODIMENT TWO, the stress releasing structure 500 is positioned in a region 107 between the outer edge of the region covered by the thin film encapsulation layer 27, 28, and 29 and an outer edge of the ESD preventing area 104.

Thus, the EMBODIMENT TWO of the present disclosure provides the display panel 1000 having a display area and a non-display area surrounding the display area, wherein the stress releasing structure 500 is disposed in the non-display area for releasing stress, the stress releasing structure 500 comprising:

a substrate 401;

a first inorganic material layer 403 (e.g., a first gate insulation layer) disposed on the substrate 401;

a first patterned conductor layer 406 (e.g., a first gate electrode layer) disposed on the first inorganic material layer 403;

a second inorganic material layer 404 (e.g., a second gate insulation layer) disposed on the first inorganic material layer 403 and the first patterned conductor layer 406;

a third inorganic material layer 405 (e.g., an interlayer dielectric layer) disposed on the second inorganic material layer 404; and a second patterned conductor layer 407 (e.g., a source and drain electrode layer) disposed on the third inorganic material layer 405, wherein the second patterned conductor layer 407 is connected to the first patterned conductor layer 406 via at least one first through-hole 408.

In the present EMBODIMENT TWO, the stress releasing structure 500 is positioned in the region 107 between the outer edge of the region covered by the thin film encapsulation layer 27, 28, and 29 and the outer edge of the ESD preventing area 104.

The first patterned conductor layer 406, the second patterned conductor layer 407, and the first through-hole 408 are respectively formed at the same time as the gate electrode 22/23, the source and drain electrode 25, and the via hole 24 are formed in the active area 101 or the GOA area 102. Thus, the first patterned conductor layer 406 is disposed at the same layer as where the gate electrode 22/23 is disposed in the active area 101 or the GOA area 102, and is made of the same material as that of the gate electrode 22/23. The second patterned conductor layer 407 is disposed at the same layer as where the source and drain electrode 25 is disposed in the active area 101 or the GOA area 102, and is made of the same material as that of the source and drain electrode 25. The first through-hole 408 is disposed at the same layer as where the via hole 24 is disposed in the active area 101 or the GOA area 102.

Preferably, the first patterned conductor layer 406, the ESD preventing wirings 26, and the gate electrode 22/23 are made of molybdenium. Preferably, the second patterned conductor layer 407 and the source and drain electrode 25 are made of titanium/aluminum/titanium.

EMBODIMENT TWO of the present disclosure is characterized in that the stress releasing structure 500 is positioned in the region 107 between the outer edge of the region covered by the thin film encapsulation layer 27, 28, and 29 and an outer edge of the ESD preventing area 104. The stress releasing structure 500 is formed at the same time as the transistor formed in the active area 101 or the GOA area 102 using same mask. Therefore, formation of the stress releasing structure 500 does not remarkably increase manufacturing cost of display panels. The present disclosure provides a design that has low manufacturing cost. In addition, the display panel 1000 does not require additional space to accommodate the stress releasing structure 500. The stress releasing structure 500 is formed in the outer peripheral region 108 (specifically in region 107) of the display panel 1000. Thus, the present disclosure provides a design that does not affect the original structure of the display panel. Moreover, the second patterned conductor layer 407 is made of titanium/aluminum/titanium that is flexible. Therefore, the stress releasing structure 500 can effectively release stress accumulated in the inorganic films (such as the buffer layer 402, the first inorganic material layer 403, the second inorganic material layer 404, and the third inorganic material layer 405) in the outer peripheral region of the display panel, thus preventing cracks from extending from the peripheral region of the display panel towards inside of display panel, and avoiding abnormally displayed images.

Embodiment Three

Figure 3:
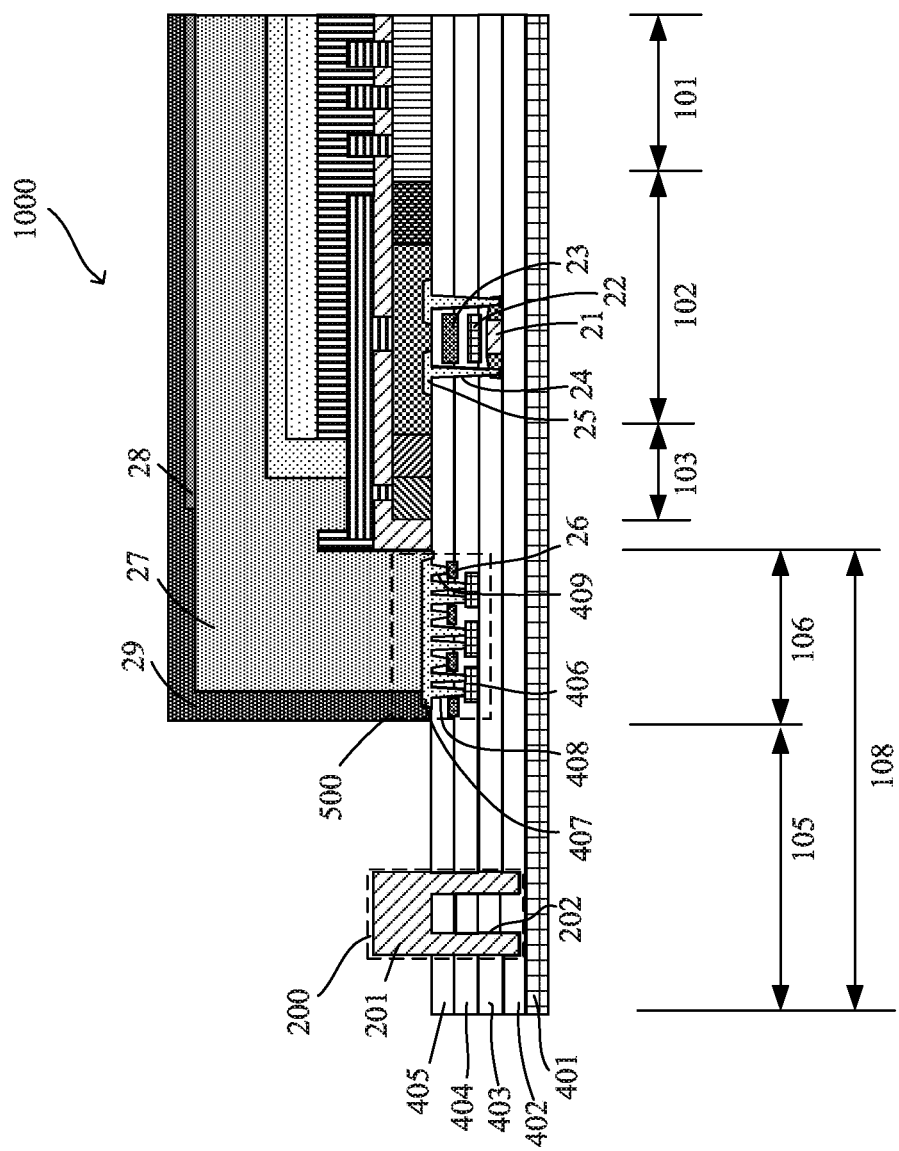
FIG. 3 shows a cross-sectional view of an OLED display panel according to EMBODIMENT THREE of the present disclosure.

Please refer to FIG. 3, which shows a cross-sectional view of an OLED display panel according to EMBODIMENT THREE of the present disclosure.

The present EMBODIMENT THREE differs from the EMBODIMENT ONE in that, in the EMBODIMENT THREE, the stress releasing structure 500 is positioned in a region 106 between the outer edge of the region covered by the thin film encapsulation layer 27, 28, and 29 and an outer edge of the power wiring area 103.

The stress releasing structure 500 further comprises a third patterned conductor layer 26 (i.e., the ESD preventing wirings) disposed on the second inorganic material layer 404. The second patterned conductor layer 407 is connected to the third patterned conductor layer 26 via at least one second through-hole 409.

Thus, the EMBODIMENT THREE of the present disclosure provides the display panel 1000 having a display area and a non-display area surrounding the display area, wherein the stress releasing structure 500 is disposed in the non-display area for releasing stress, the stress releasing structure 500 comprising:

a substrate 401;

a first inorganic material layer 403 (e.g., a first gate insulation layer) disposed on the substrate 401;

a first patterned conductor layer 406 (e.g., a first gate electrode layer) disposed on the first inorganic material layer 403;

a second inorganic material layer 404, (e.g., a second gate insulation layer) disposed on the first inorganic material layer 403 and the first patterned conductor layer 406;

a third inorganic material layer 405, (e.g., an interlayer dielectric layer) disposed on the second inorganic material layer 404; and a second patterned conductor layer 407, (e.g., a source and drain electrode layer) disposed on the third inorganic material layer 405, wherein the second patterned conductor layer 407 is connected to the first patterned conductor layer 406 via at least one first through-hole 408.

In the present EMBODIMENT THREE, the stress releasing structure 500 is positioned in the region 106 between the outer edge of the region covered by the thin film encapsulation layer 27, 28, and 29 and the outer edge of the power wiring area 103.

The first patterned conductor layer 406, the second patterned conductor layer 407, and the first through-hole 408 are respectively formed at the same time as the gate electrode 22/23, the source and drain electrode 25, and the via hole 24 are formed in the active area 101 or the GOA area 102. Thus, the first patterned conductor layer 406 is disposed at the same layer as where the gate electrode 22/23 is disposed in the active area 101 or the GOA area 102, and is made of the same material as that of the gate electrode 22/23. The second patterned conductor layer 407 is disposed at the same layer as where the source and drain electrode 25 is disposed in the active area 101 or the GOA area 102, and is made of the same material as that of the source and drain electrode 25. The first through-hole 408 is disposed at the same layer as where the via hole 24 is disposed in the active area 101 or the GOA area 102.

Preferably, the first patterned conductor layer 406, the ESD preventing wirings 26, and the gate electrode 22/23 are made of molybdenium. Preferably, the second patterned conductor layer 407 and the source and drain electrode 25 are made of titanium/aluminum/titanium.

EMBODIMENT THREE of the present disclosure is characterized in that the stress releasing structure 500 is positioned in the region 106 between the outer edge of the region covered by the thin film encapsulation layer 27, 28, and 29 and the outer edge of the power wiring area 103. The stress releasing structure 500 is formed at the same time as the transistor formed in the active area 101 or the GOA area 102 using the same mask. Therefore, formation of the stress releasing structure 500 does not remarkably increase manufacturing cost of display panels. The present disclosure provides a design that has low manufacturing cost. In addition, the display panel 1000 does not require additional space to accommodate the stress releasing structure 500. The stress releasing structure 500 is formed in the outer peripheral region 108 (specifically in the region 106) of the display panel 1000. Thus, the present disclosure provides a design that does not affect the original structure of the display panel. Moreover, the second patterned conductor layer 407 is made of titanium/aluminum/titanium that is flexible. Therefore, the stress releasing structure 500 can effectively release stress accumulated in the inorganic films (such as the buffer layer 402, the first inorganic material layer 403, the second inorganic material layer 404, and the third inorganic material layer 405) in the outer peripheral region of the display panel, thus preventing cracks from extending from the peripheral region of the display panel towards inside of display panel, and avoiding abnormally displayed images.

Please note that since the ESD preventing wirings 26 formed according to prior art have a line width and/or an interval therebetween that are too small, using the existing process technique cannot form the stress releasing structure 500 in the ESD preventing area 104 due to process constraints. However, in EMBODIMENT THREE of the present disclosure, the formed position, the line width, and the interval of the ESD preventing wirings 26 are adjusted. For example, the third patterned conductor layer 26 (i.e., the ESD preventing wirings) are adjusted to have a line width ranging from 5 µm to 8 µm, and the third patterned conductor layer is spaced from another adjacent third patterned conductor layer by an interval ranging from 6 µm to 9 µm. In addition, the ESD preventing wirings 26 are incorporated into the stress releasing structure. Therefore, the ESD preventing wirings 26 formed according to EMBODIMENT THREE of the present disclosure function to not only protect the electrical components in the display panel from being damaged by electrostatic discharges but prevent cracks from extending.

In addition, the present disclosure provides a method for manufacturing a display panel 1000 having a display area and a non-display area surrounding the display area, wherein the method includes forming a stress releasing structure 500 in the non-display area for releasing stress, formation of the stress releasing structure 500 comprising steps of:

providing a substrate 401;

forming a first inorganic material layer 403 on the substrate 401;

forming a first patterned conductor layer 406 on the first inorganic material layer 403;

forming a second inorganic material layer 404 on the first inorganic material layer 403 and the first patterned conductor layer 406;

forming a third inorganic material layer 405 on the second inorganic material layer 404; and forming a second patterned conductor layer 407 on the third inorganic material layer 405, wherein the second patterned conductor layer 407 is connected to the first patterned conductor layer 406 via at least one first through-hole 408.

Compared to prior art, the present disclosure provides a display panel and a method for manufacturing the same. According to the present disclosure, a stress releasing structure 500 is disposed in a non-display area of the display panel for releasing stress. The stress releasing structure 500 is formed at the same time as a transistor formed in an active area 101 or a gate driver on array (GOA) area 102 using the same mask. Therefore, formation of the stress releasing structure 500 does not remarkably increase manufacturing cost of the display panels. The present disclosure provides a design that has low manufacturing cost. In addition, the display panel 1000 does not require additional space to accommodate the stress releasing structure 500. The stress releasing structure 500 is formed in the outer peripheral region 108 of the display panel. Therefore, once the display panel 1000 is bent, stress accumulated in the inorganic films can be effectively released by the tress releasing structure 500. The present disclosure prevents cracks from extending towards inside of the display panel, and avoids abnormally displayed images.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A display panel having a display area and a non-display area surrounding the display area, wherein a stress releasing structure is disposed in the non-display area for releasing stress, the stress releasing structure comprising:
   a substrate;
   a first inorganic material layer disposed on the substrate;
   a first patterned conductor layer disposed on the first inorganic material layer;
   a second inorganic material layer disposed on the first inorganic material layer and the first patterned conductor layer;
   a third inorganic material layer disposed on the second inorganic material layer; and
   a second patterned conductor layer disposed on the third inorganic material layer and connected to the first patterned conductor layer via at least one first through-hole;
   wherein the display area includes an active area, and the non-display area includes a gate driver on array (GOA) area, a power wiring area, and an electrostatic discharge (ESD) preventing area from inside of the display panel towards outside of the display panel;
   wherein transistors are disposed in the active area and the GOA area, and each of the transistors includes a polysilicon layer, a gate electrode, a via hole, a source electrode, and a drain electrode; and
   wherein the first patterned conductor layer is disposed at a same layer as where the gate electrode is disposed in the active area or the GOA area, and is made of a same material as that of the gate electrode; the second patterned conductor layer is disposed at a same layer as where the source electrode and the drain electrode are disposed in the active area or the GOA area, and is made of a same material as that of the source electrode and the drain electrode; the first through-hole is disposed at a same layer as where the via hole is disposed in the active area or the GOA area.

2. The display panel according to claim 1, wherein a thin film encapsulation layer covers the active area, the GOA area, the power wiring area, and the ESD preventing area.

3. The display panel according to claim 2, wherein the stress releasing structure is positioned in a region outside of an outer edge of a region covered by the thin film encapsulation layer.

4. The display panel according to claim 3, wherein
   the display panel further comprises a crack extension preventing structure;
   the stress releasing structure is positioned between the outer edge of the region covered by the thin film encapsulation layer and the crack extension preventing structure; and the stress releasing structure further comprises a patterned organic planarization layer, and the patterned organic planarization layer is disposed on the second patterned conductor layer.

5. The display panel according to claim 2, wherein the stress releasing structure is positioned in a region between an outer edge of a region covered by the thin film encapsulation layer and an outer edge of the ESD preventing area.

6. The display panel according to claim 2, wherein the stress releasing structure is positioned in a region between an outer edge of a region covered by the thin film encapsulation layer and an outer edge of the power wiring area.

7. The display panel according to claim 6, wherein the stress releasing structure further comprises a third patterned conductor layer disposed on the second inorganic material layer; and
the second patterned conductor layer is connected to the third patterned conductor layer via at least one second through-hole.

8. The display panel according to claim 7, wherein the third patterned conductor layer has a line width ranging from 5 μm to 8 μm, and the third patterned conductor layer is spaced from another adjacent third patterned conductor layer by an interval ranging from 6 μm to 9 μm.

9. A display panel having a display area and a non-display area surrounding the display area, wherein a stress releasing structure is disposed in the non-display area for releasing stress, the stress releasing structure comprising:
a substrate;
a first inorganic material layer disposed on the substrate;
a first patterned conductor layer disposed on the first inorganic material layer;
a second inorganic material layer disposed on the first inorganic material layer and the first patterned conductor layer;
a third inorganic material layer disposed on the second inorganic material layer; and
a second patterned conductor layer disposed on the third inorganic material layer and connected to the first patterned conductor layer via at least one first through-hole.

10. The display panel according to claim 9, wherein
the display area includes an active area, and the non-display area includes a gate driver on array (GOA) area, a power wiring area, and an electrostatic discharge (ESD) preventing area from inside of the display panel towards outside of the display panel; and
a thin film encapsulation layer covers the active area, the GOA area, the power wiring area, and the ESD preventing area.

11. The display panel according to claim 10, wherein the stress releasing structure is positioned in a region outside of an outer edge of a region covered by the thin film encapsulation layer.

12. The display panel according to claim 11, wherein
the display panel further comprises a crack extension preventing structure;
the stress releasing structure is positioned between the outer edge of the region covered by the thin film encapsulation layer and the crack extension preventing structure; and
the stress releasing structure further comprises a patterned organic planarization layer, and the patterned organic planarization layer is disposed on the second patterned conductor layer.

13. The display panel according to claim 10, wherein the stress releasing structure is positioned in a region between an outer edge of a region covered by the thin film encapsulation layer and an outer edge of the ESD preventing area.

14. The display panel according to claim 10, wherein the stress releasing structure is positioned in a region between an outer edge of a region covered by the thin film encapsulation layer and an outer edge of the power wiring area.

15. The display panel according to claim 14, wherein
the stress releasing structure further comprises a third patterned conductor layer disposed on the second inorganic material layer; and
the second patterned conductor layer is connected to the third patterned conductor layer via at least one second through-hole.

16. The display panel according to claim 15, wherein the third patterned conductor layer has a line width ranging from 5 μm to 8 μm, and the third patterned conductor layer is spaced from another adjacent third patterned conductor layer by an interval ranging from 6 μm to 9 μm.

17. The display panel according to claim 10,
wherein transistors are disposed in the active area and the GOA area, and each of the transistor includes a polysilicon layer, a gate electrode, a via hole, and a source electrode and drain electrode; and
wherein the first patterned conductor layer is disposed at a same layer as where the gate electrode is disposed in the active area or the GOA area, and is made of a same material as that of the gate electrode; the second patterned conductor layer is disposed at a same layer as where the source electrode and the drain electrode are disposed in the active area or the GOA area, and is made of a same material as that of the source electrode and the drain electrode; the first through-hole is disposed at a same layer as where the via hole is disposed in the active area or the GOA area.

18. A method for manufacturing a display panel having a display area and a non-display area surrounding the display area, wherein the method includes forming a stress releasing structure in the non-display area for releasing stress, formation of the stress releasing structure comprising steps of:
providing a substrate;
forming a first inorganic material layer on the substrate;
forming a first patterned conductor layer on the first inorganic material layer;
forming a second inorganic material layer on the first inorganic material layer and the first patterned conductor layer;
forming a third inorganic material layer on the second inorganic material layer; and
forming a second patterned conductor layer on the third inorganic material layer, wherein the second patterned conductor layer is connected to the first patterned conductor layer via at least one first through-hole.

* * * * *

UNITED STATES PATENT AND TRADEMARK OFFICE
CERTIFICATE OF CORRECTION

PATENT NO. : 10,923,548 B2  
APPLICATION NO. : 16/468679  
DATED : February 16, 2021  
INVENTOR(S) : Zhiwei Zhou and Seungkyu Choi Page 1 of 1

It is certified that error appears in the above-identified patent and that said Letters Patent is hereby corrected as shown below:

On the Title Page

(30) Foreign Application Priority Data should read:
"February 25, 2019 (CN) 201910139114.7"

Signed and Sealed this
Twentieth Day of April, 2021

Drew Hirshfeld
*Performing the Functions and Duties of the
Under Secretary of Commerce for Intellectual Property and
Director of the United States Patent and Trademark Office*